United States Patent
Martin et al.

(12)

(10) Patent No.: US 6,281,712 B1
(45) Date of Patent: Aug. 28, 2001

(54) PHASE DETECTOR WITH FREQUENCY STEERING

(75) Inventors: Frederick L. Martin, Plantation; Jeremy Marks, Sunrise, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/654,698

(22) Filed: Sep. 5, 2000

(51) Int. Cl.$^7$ .................................................. H03K 25/00
(52) U.S. Cl. ..................................... 327/3; 327/12; 327/3
(58) Field of Search ................................. 327/1, 3, 12, 2, 327/7, 10; 324/76.77, 76.83; 360/45; 331/1 A, 4

(56) References Cited

U.S. PATENT DOCUMENTS

| Re. 36,874 | * | 9/2000 | Chen | 331/1 R |
| 4,241,365 | * | 12/1980 | Koda et al. | 360/73 |
| 4,764,737 | | 8/1988 | Kaatz | 331/1 A |
| 5,179,358 | * | 1/1993 | Martin | 331/1 A |
| 5,325,241 | * | 6/1994 | Mattison et al. | 360/45 |
| 5,903,195 | * | 5/1999 | Lukes et al. | 331/4 |
| 6,002,273 | | 12/1999 | Humphreys | 327/3 |

OTHER PUBLICATIONS

Types of Phase Detectors, Section 5.1.3 Exclusive OR, pp. 103–104, 1981 John Wiley & Sons, Inc., Canada and USA.

\* cited by examiner

*Primary Examiner*—Tuan T. Lam
*Assistant Examiner*—Hiep Nguyen
(74) *Attorney, Agent, or Firm*—Randi L. Dulaney

(57) ABSTRACT

A phase detector circuit (100) operating at a high frequency includes a steering circuit (112) operating on frequency-divided versions of the phase detector signals. The phase detector (100) implements steering by adding dividers (108, 110) at both input ports to the steering circuit (112). This achieves the desired effect of reducing the operating frequency of the input signals to the steering circuit (112) to make operation possible at high frequencies of operation. The phase detector (100) also allows the steer circuit (112) to be turned off in steady state operation, this is accomplished by coupling only the steer outputs of the steering circuit (12) to the tuning line. The phase/frequency detect outputs are not coupled to the tuning line.

10 Claims, 3 Drawing Sheets

PHASE DETECTOR WITH FREQUENCY STEERING

TECHNICAL FIELD

This invention relates in general to phase detectors, and more particularly, to a phase detector circuit having frequency steering.

BACKGROUND

In a phase-locked-loop (PLL), frequency steering is the responsibility of the phase detector circuit that causes the frequency of a voltage controlled oscillator (VCO) that is out of the lock range of the loop to move towards the correct steady-state value. The exclusive-OR logic gate, the most commonly used circuit for high-speed phase detector applications, does not effect frequency steering. Digital phase detectors that have frequency steering on the other hand are too slow for high-speed applications (>100 MHz) when implemented in technology available today.

PLL's with very high (typically greater than 100 MHz) reference frequencies, while not common today, are likely to be used in transmitters and frequency synthesizers in future radio products. The advantage of such loops is a low closed-loop gain, which results in low in-band noise. This is necessary in wide-bandwidth loops for cleanup of VCO noise and reduced interference. Given the above, a need exists in the art for a phase detector with frequency steering that can overcome the above-mentioned limitations.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, and in which:

DETAILED DESCRIPTION OF THE PREFERRED EMBODIMENT

Figure 1:
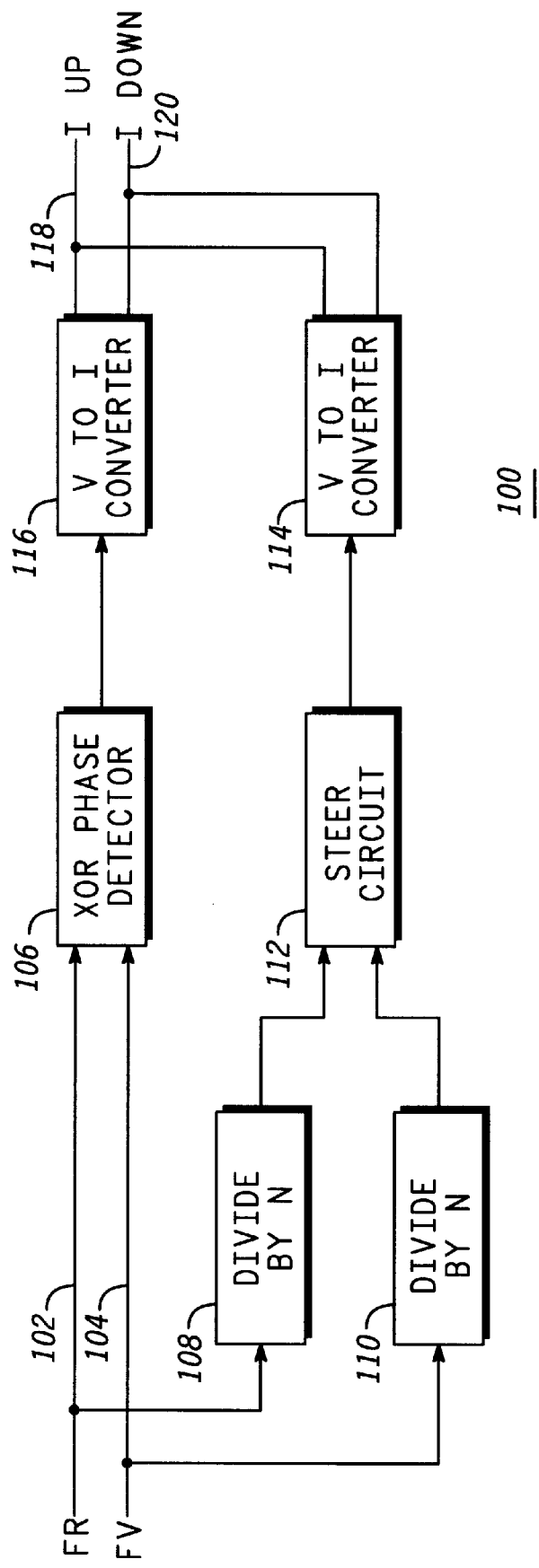
FIG. 1 shows a block diagram of a phase detector with frequency steering in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a phase detector circuit 100 having a steering circuit 112. The phase detector circuit 100 includes an exclusive-OR (XOR) phase detector 106 as known in the art. Although an XOR phase detector is used in the preferred embodiment, a mixer, Gilbert Cell, or other known circuits can be substituted for the phase detector 106. The phase detector 106 generates an output based on the difference in phase between input signals FV 104 and FR 102. The steer circuit 112 is also responsive to the relative phases of FV 104 and FR 102, but the signals are first processed by a pair of dividers, 108 and 110, which have a common divisor N.

The binary output of phase detector 106 is converted into two binary current outputs by voltage-to-current converter 116, each current output responsive to one state of the output of phase detector 106 by voltage-to-current converter 116. The two binary outputs of the steering circuit 112 are converted into two binary outputs by voltage-to-current converter 114, each responsive to one of the outputs of steering circuit 112 by voltage-to-current converter 114. The outputs of the two voltage-to-current converters 114 and 116 are combined to produce the phase detector circuit's output currents, IUP 118 and IDOWN 120.

The outputs of the phase detector circuit 100, IUP 118 and IDOWN 120 are combined to produce a signal to drive the tuning port on a VCO (not shown) which is part of the phase-locked loop of which the phase detector circuit 100 is a part of. Other ways of accomplishing this combination can include for example, voltage summation blocks, summing separate currents in the main loop cap of a loop filter, etc.

For best operation, the relative magnitude of the currents at the outputs of converters 114 and 116 must be adjusted to ensure the magnitudes of the outputs are slightly higher at output 114 than at output 116. If the currents at output 116 are too small, steering response is sluggish. If the currents are too large, instability and failure to lock occur.

Figure 2:
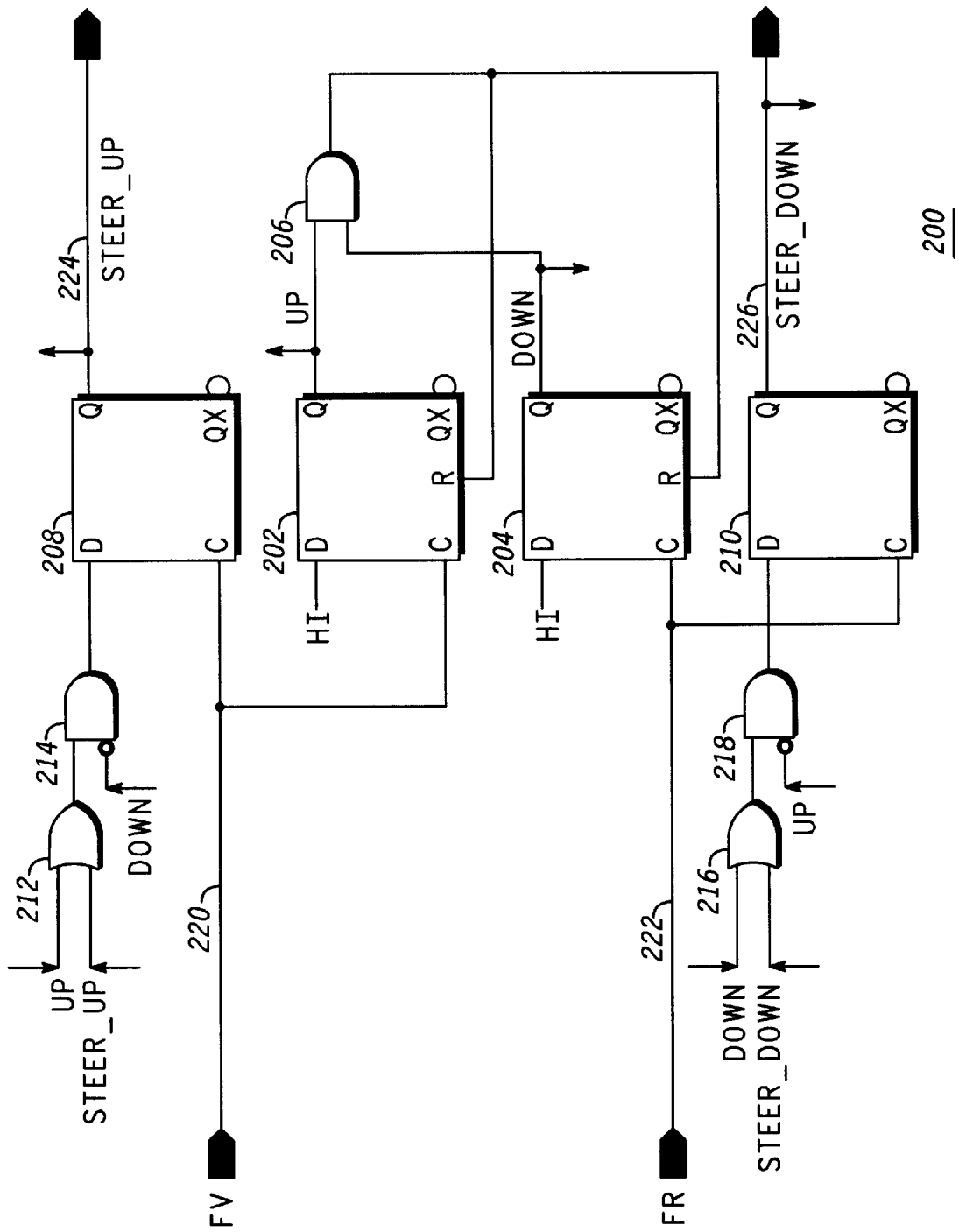
FIG. 2 shows a more detailed schematic diagram of the steering circuit block shown in FIG. 1 in accordance with the invention.

A more detailed schematic diagram of steer circuit 112 is shown in FIG. 2, as circuit 200. As shown, circuit 200 operates as a tri-state detector with latches to capture the steer states. The tri-state detector comprises multistate multivibrators (commonly referred to as "flip-flops") 202 and 204, and AND logic gate 206. Flip-flops 208 and 210 act to capture steer states STEER_UP and STEER_DOWN, respectively. Logic gates 212 and 214 define the condition under which the steer circuit 200 enters or holds the STEER_UP state 224. Logic gates 216 and 218 define the condition under which the steer circuit 200 enters or holds the STEER_DOWN state 226. Inputs to the circuit 200 are clock inputs FV 220 and FR 222. Outputs to the circuit 200 are steer lines STEER_UP 224 and STEER_DOWN 226.

In the present invention the outputs UP and DOWN of the phase frequency detector are fed back within the steering circuit 200, but are not ported outside of the steering circuit 200. The steering outputs STEER_UP 224 and STEER_DOWN 226 are fed back within the steering circuit 200 and are coupled to the VCO steering line in the PLL (not shown).

Figure 3:
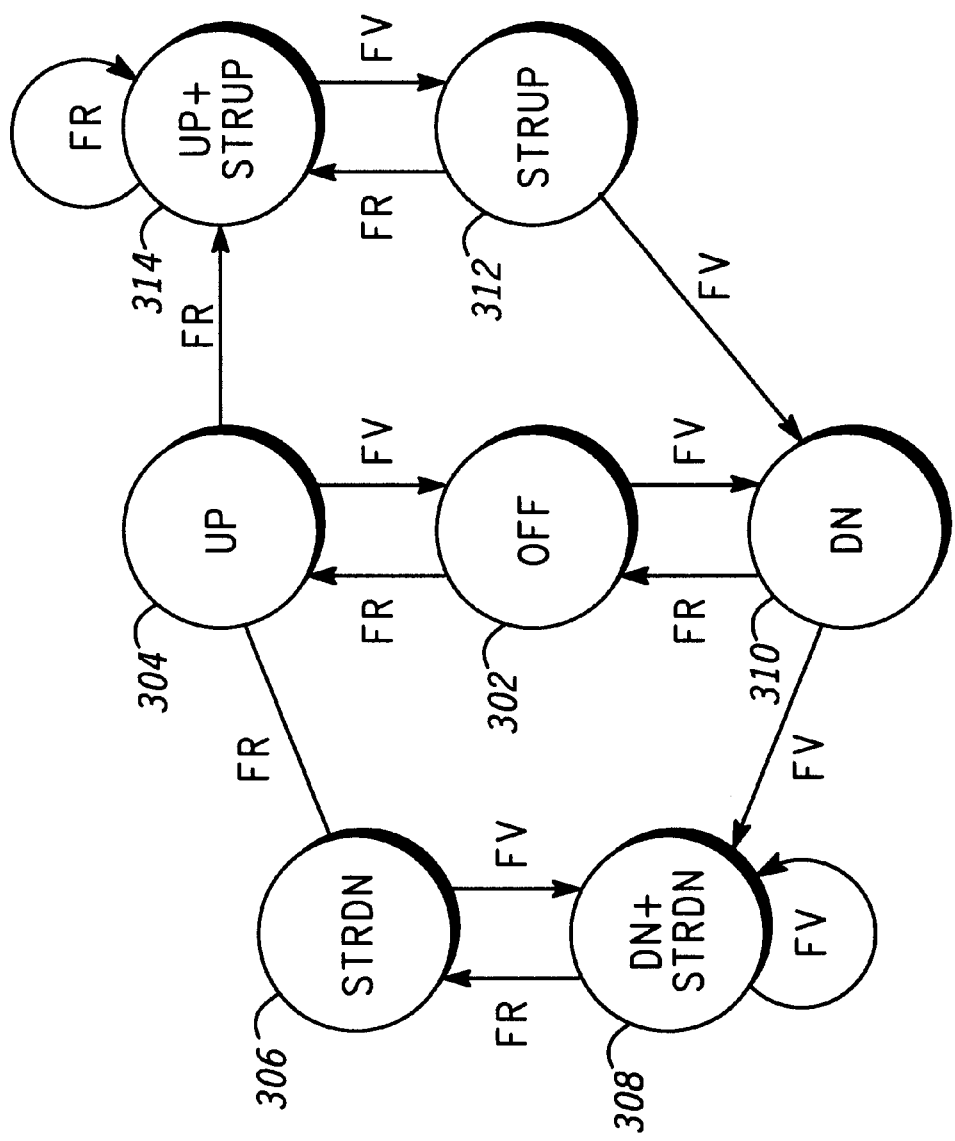
FIG. 3 shows a state diagram for the phase detector with steering in accordance with the invention.

Operation of the steer circuit shown in FIGS. 1 and 2 can be better understood by referring to the state diagram of FIG. 3. In FIG. 3, STRUP stands for steer up, while STRDN stands for steer down in the state diagram. When the PLL is in lock, circuit operation toggles between the UP 304, DOWN (DN) 310, and OFF 302 states. Beginning in the OFF state, an input pulse FR moves the circuit to the UP state. An FV pulse moves the circuit to the DOWN state. When the circuit is in the UP state, an FV pulse returns the circuit to the OFF state. When the circuit is in the DOWN state, an FR pulse returns the circuit to the OFF state. Typically, for an in-lock condition, consecutive pulses on the same input (FR or FV) do not occur. When the circuit is operating in the in-lock states (UP, DOWN, OFF), no signals are coupled from the steering circuit 112 to the VCO tuning line (not shown).

When the circuit is not in an in-lock condition, consecutive pulses can occur on a single input line, moving the circuit to a steer condition. This can be explained by considering the operation of the circuit, beginning in the OFF state, in response to a series of consecutive pulses on input FR. For this scenario, the first pulse will move the circuit to the UP state. The second pulse will move the circuit to state UP+STEER UP (UP+STRUP) 314. For subsequent pulses on input FR, the circuit will remain in the UP+STEER UP state. From the UP+STEER UP state, a pulse on input FV will move the circuit to the STRUP 312 state. A second consecutive pulse on FV will move the circuit to the DOWN state. An analogous scenario can be constructed for consecutive pulses on FV where the circuit moves through states DOWN+STEER DOWN (DN+STRDN) 308 and STEER DOWN (STRDN) 306.

When the steer circuit state is either UP+STRUP or STRUP, a signal is coupled to the VCO tuning line (not shown) causing the VCO frequency to increase. When the steer circuit state is either DOWN+STEER DOWN or STEER DOWN, a signal is coupled to the VCO tuning line causing the VCO frequency to decrease.

Viewing the phase detector circuit 100 as a whole, one of the key elements of the design is that the exclusive-OR gate phase detector 106, with its superior high-speed operation, acts as a normal phase detector. The tri-state detector with latched steering outputs, with its ability to provide steering, operates continuously but provides outputs to the PLL (not shown) only when its inputs are at different frequencies and steering by steer circuit 112 is needed. Thus, the phase detector circuit 100 retains the high-speed performance of phase detector 106 while exhibiting frequency steering. These advantages make the phase detector circuit 100 desirable for use in a wide variety of phase lock loops and electronic devices, including radios and possibly disk drives or tape recording devices.

One fundamental problem solved by the present invention is how to implement steering when existing integrated circuit technology does not support the required speed of operation. In the present invention this problem is overcome by adding frequency dividers 108, 110 at both input ports to the steering circuit. This achieved the desired effect of reducing the operating frequency of the input signals to the steering circuit 112 to make operation possible. A second problem that was found was how to disable output of the steer circuit 112 when the phase detector circuit was in steady state operation (no need for UP or DOWN adjustment). Coupling the latched steering outputs of the steering circuit 112 to the tuning line solved this second problem. Also, the phase/frequency detect outputs are not coupled to the tuning line. Because the phase range over which the steering circuit 112 has no output response is many times the phase range of the phase detector 106 (a result of the dividers 108, 110 at the steering circuit input), an offset current in the phase detector may be added.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A phase detector circuit, comprising:

a phase detector having input ports for receiving first and second input signals and providing an output signal in response to the first and second input signals;

a first divider circuit for receiving the first input signal and providing a first divided input signal;

a second divider circuit for receiving the second input signal and providing a second divided input signal;

a steering circuit responsive to the first and second divided input signals, the steering circuit providing a steering output signal; and the output signal of the phase detector is combined with the steering output signal to generate an output of the phase detector circuit.

2. A phase detector circuit as defined in claim 1, wherein the output signal of the phase detector is combined with the steering output signal using voltage-to-current converters.

3. A phase detector circuit as defined in claim 1, wherein the steering circuit is operating at a lower frequency than the phase detector.

4. A phase detector circuit as defined in claim 1, wherein said first and second divider circuits have a common divisor (N).

5. A phase detector circuit as defined in claim 1, wherein the steering circuit output signal is disabled when the phase detector circuit is in steady state operation.

6. A phase detector circuit as defined in claim 1, wherein the phase detector comprises an exclusive-OR phase detector.

7. A phase detector circuit as defined in claim 6, further comprising:

a first voltage-to-current converter for receiving the phase detector's output signal; and a second voltage-to-current converter for receiving the steering circuit's output signal.

8. A phase detector circuit as defined in claim 7, wherein:

the first voltage-to-current converter provides first and second output signals;

the second voltage-to-current converter provides first and second output signals, and the first output signal from the first voltage-to-current converter is coupled to the first output signal from the second voltage-to-current converter, and the second output signal from the first voltage-to-current converter is coupled to the second output signal from the second voltage-to-current converter.

9. An electronic device that comprises the phase detector circuit as defined in claim 1.

10. A phase lock loop that comprises the phase detector circuit as defined in claim 1.

* * * * *